US012708928B2

(12) United States Patent
Nagata et al.

(10) Patent No.: US 12,708,928 B2
(45) Date of Patent: Aug. 18, 2026

(54) VIBRATION ACTUATOR CONTROLLER

(71) Applicant: CANON KABUSHIKI KAISHA, Tokyo (JP)

(72) Inventors: Taiga Nagata, Kanagawa (JP); Akio Atsuta, Kanagawa (JP); Hiromitsu Morita, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 969 days.

(21) Appl. No.: 18/049,228

(22) Filed: Oct. 24, 2022

(65) Prior Publication Data

US 2023/0137002 A1 May 4, 2023

(30) Foreign Application Priority Data

Oct. 28, 2021 (JP) ................................ 2021-176787

(51) Int. Cl.
*B06B 1/06* (2006.01)
*H10N 30/20* (2023.01)
*H10N 30/30* (2023.01)

(52) U.S. Cl.
CPC ........... *B06B 1/0644* (2013.01); *H10N 30/20* (2023.02); *H10N 30/302* (2023.02)

(58) Field of Classification Search
CPC ......... H10N 2/14; H10N 30/30; B06B 1/0644
See application file for complete search history.

(56) References Cited

U.S. PATENT DOCUMENTS 6,313,564 B1 * 11/2001 Kataoka .................. H02N 2/14 310/316.01
9,276,502 B2 * 3/2016 Murakami ............ H02N 2/142
2005/0046308 A1 * 3/2005 Endo ...................... H02N 2/142 310/317
2011/0304933 A1 * 12/2011 Uchiyama ............. H02N 2/103 318/116
2015/0125140 A1 * 5/2015 Ashizawa ............. H02N 2/163 396/125
2016/0241167 A1 * 8/2016 Miyajima ................ G02B 7/04
2021/0021211 A1 * 1/2021 Morita ..................... H02N 2/06
2023/0147581 A1 * 5/2023 Sumioka ................ G06N 20/00 348/208.7

FOREIGN PATENT DOCUMENTS

JP 2010183816 A 8/2010
JP 2018133873 A 8/2018
JP 2019198199 A 11/2019
JP 2021019399 A 2/2021

* cited by examiner

*Primary Examiner* — J. San Martin
(74) *Attorney, Agent, or Firm* — Canon U.S.A., Inc. IP Division

(57) ABSTRACT

A vibration actuator controller is configured to control a vibration actuator that includes a vibrating member having an electromechanical energy conversion element and that includes a contact member in contact with the vibrating member. The contact member is configured to move relative to the vibrating member in response to a plurality of pulse signals. The vibration actuator controller includes a processor configured to control a relative movement speed, which is a speed at which the contact member moves relative to the vibrating member, by changing a pulse width of the plurality of pulse signals while maintaining a frequency of the plurality of pulse signals. When the relative movement speed is controlled, the frequency is shifted such that the pulse width and the relative movement speed satisfy a predetermined relationship.

5 Claims, 17 Drawing Sheets

FIG. 4

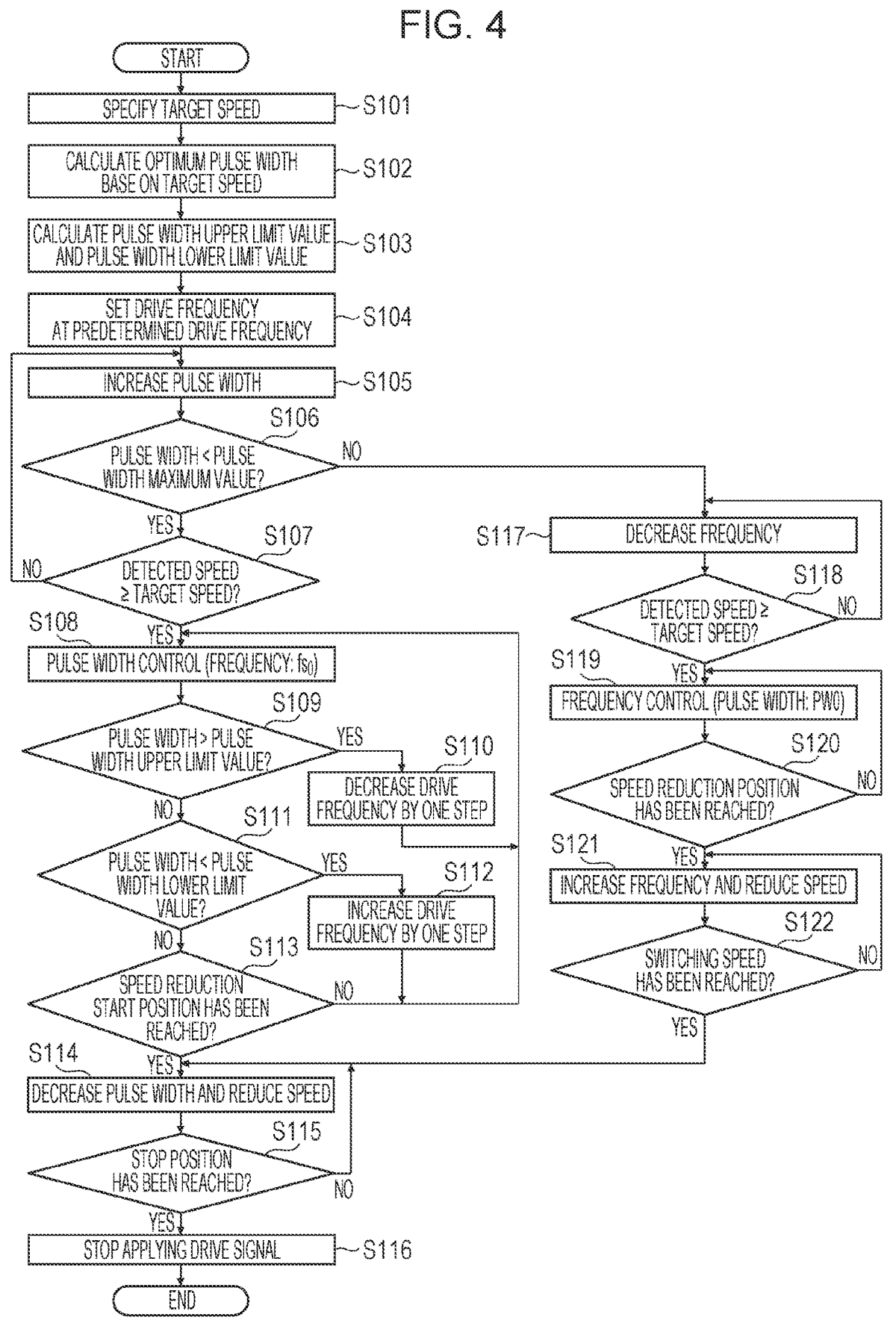

START

S101 SPECIFY TARGET SPEED

S102 CALCULATE OPTIMUM PULSE WIDTH BASE ON TARGET SPEED

S103 CALCULATE PULSE WIDTH UPPER LIMIT VALUE AND PULSE WIDTH LOWER LIMIT VALUE

S104 SET DRIVE FREQUENCY AT PREDETERMINED DRIVE FREQUENCY

S105 INCREASE PULSE WIDTH

S106 PULSE WIDTH < PULSE WIDTH MAXIMUM VALUE? (YES → S107, NO → S117)

S107 DETECTED SPEED ≥ TARGET SPEED? (YES → S108, NO → S105)

S108 PULSE WIDTH CONTROL (FREQUENCY: $fs_0$)

S109 PULSE WIDTH > PULSE WIDTH UPPER LIMIT VALUE? (YES → S110, NO → S111)

S110 DECREASE DRIVE FREQUENCY BY ONE STEP

S111 PULSE WIDTH < PULSE WIDTH LOWER LIMIT VALUE? (YES → S112, NO → S113)

S112 INCREASE DRIVE FREQUENCY BY ONE STEP

S113 SPEED REDUCTION START POSITION HAS BEEN REACHED? (YES → S114, NO → S108)

S114 DECREASE PULSE WIDTH AND REDUCE SPEED

S115 STOP POSITION HAS BEEN REACHED? (YES → S116, NO → S114)

S116 STOP APPLYING DRIVE SIGNAL

END

S117 DECREASE FREQUENCY

S118 DETECTED SPEED ≥ TARGET SPEED? (YES → S119, NO → S117)

S119 FREQUENCY CONTROL (PULSE WIDTH: PW0)

S120 SPEED REDUCTION POSITION HAS BEEN REACHED? (YES → S121, NO → S119)

S121 INCREASE FREQUENCY AND REDUCE SPEED

S122 SWITCHING SPEED HAS BEEN REACHED? (YES → S114, NO → S121)

FIG. 5

| SPEED [rpm] Nv | PULSE WIDTH [%] PWv | PULSE WIDTH LOWER LIMIT VALUE [%] PWvmin | PULSE WIDTH UPPER LIMIT VALUE [%] PWvmax |
|---|---|---|---|
| 20 | 34 | 32.3 | 35.7 |
| 40 | 38 | 36.1 | 39.9 |
| 60 | 42 | 39.9 | 44.1 |
| 80 | 46 | 43.7 | 48.3 |
| 100 | 50 | 47.5 | 52.5 |

FIG. 9

Prior Art

Prior Art

Prior Art

Prior Art

Prior Art

Prior Art

VIBRATION ACTUATOR CONTROLLER

BACKGROUND

Field of the Disclosure

The present disclosure relates to a vibration actuator controller.

Description of the Related Art

Imaging devices, such as camera devices and video devices, using a vibration actuator for AF drive or zoom drive have been developed into products. The vibration actuator generates vibrations when alternating-current voltage (drive voltage) that can cause vibrations of multiple vibration modes of a vibrating member having an electromechanical energy conversion element (a piezoelectric element) attached to an elastic body is applied to the vibrating member. In response, a mover (a contact member) in pressure contact with the vibrating member is friction driven (the contact member is moved relative to the vibrating member), so that driving force is acquired.

Here, an example of a structure of a vibration motor will be described with reference to FIGS. 11 and 12. FIG. 11 is a perspective view (an exploded perspective view) of a vibration motor 200 as a vibration actuator before assembly. FIG. 12 is a perspective view of the vibration motor 200 in FIG. 11 after assembly.

In FIGS. 11 and 12, reference numeral 201 indicates a first elastic body shaped as a plate (a circular plate), made of a material of a relatively small vibration damping loss factor such as metal. Reference numeral 202 indicates a piezoelectric element serving as an electromechanical energy conversion element. Reference numeral 203 indicates a flexible substrate for applying an alternating-current signal (alternating-current voltage) from a drive power supply to the piezoelectric element 202 (electromechanical energy conversion element). Reference numeral 204 indicates a lower nut that is engaged with a screw formed at the lower end of a shaft 206. Reference numeral 205 indicates a second elastic body. A vibrating member is formed by at least the first elastic body 201, the piezoelectric element 202 (electromechanical energy conversion element), the lower nut 204, and the second elastic body 205.

The shaft 206 is inserted in through-holes formed at the center of the first elastic body 201, the piezoelectric element 202 (electromechanical energy conversion element), the flexible substrate 203, and the second elastic body 205. The shaft 206 has a step at some midpoint. This step fits a step formed at the inner wall of the second elastic body 205. A screw is formed at an end portion (lower end portion) of the shaft 206. This screw is inserted into the lower nut 204 serving as a fastener and tightened, thereby fixing the second elastic body 205, the first elastic body 201, the piezoelectric element 202 (electromechanical energy conversion element), and the flexible substrate 203.

A contact spring 208 fixed to a mover 207 (contact member) is in pressure contact with a surface of the first elastic body 201; the surface is opposite to the surface contacting the piezoelectric element 202 (electromechanical energy conversion element). This contact spring 208 has elasticity. The contact spring 208 is fixed to the mover 207 (contact member) and rotates in conjunction with the mover 207 (contact member). Reference numeral 209 indicates a gear serving as an outputter. The gear 209 is engaged with the mover 207 (contact member) such that the gear 209 rotates in conjunction with the mover 207 (contact member) while allowing the mover 207 (contact member) to move in the rotation axis direction.

Reference numeral 210 indicates a coil spring serving as a pressurizer. The coil spring 210 is disposed between a spring receiver portion of the mover 207 (contact member) and the gear 209. The coil spring 210 applies pressure on the mover 207 (contact member) to push the mover 207 (contact member) down toward the first elastic body 201. The gear 209 is rotatably supported by a fixing member 211 joined with the shaft 206. The position of the gear 209 in the axial direction is the fixing member 211. Another screw is formed at an end portion (upper end portion) of the shaft 206; the end portion is opposite to the end portion engaged with the lower nut 204. This screw is inserted in an upper nut 212, thereby fixing the shaft 206 to the fixing member 211. Screw holes are formed in the fixing member 211. By fixing the fixing member 211 at a desired position with screws, the vibration motor can be fixed at the desired position.

The piezoelectric element 202 (electromechanical energy conversion element) includes a drive electrode A for generating a first bending vibration, which is not illustrated in the drawing. Vibrations of an A mode is generated by applying a predetermined alternating-current voltage to the drive electrode A. The piezoelectric element 202 (electromechanical energy conversion element) also includes a drive electrode B for a bending vibration that is phase shifted by 90° with respect to the first bending vibration in the rotation direction. Vibrations of a B mode is generated by applying a predetermined alternating-current voltage to the drive electrode B. Alternating current signals of different phases close to the resonant frequency of the vibrating member are respectively applied to the drive electrodes, and as a result, vibrations producing force in the rotation direction occur at the first elastic body 201.

At this moment, elliptical motion is generated at individual positions of the first elastic body 201 in the drive direction; the elliptical motion is based on motion in the longitudinal direction (axial direction) orthogonal to the rotation direction and motion in the rotation direction (lateral direction). When the contact spring 208 is brought into pressure contact with the surface of the first elastic body 201 moving with this elliptical motion, the contact spring 208 and the mover 207 (contact member) are moved by driving force caused by this elliptical motion.

When providing zooming with a product in which the vibration actuator 200 drives a lens, it is necessary to move the lens smoothly. Additionally, such a vibration actuator for driving the lens needs constant speed control for stable motion at a constant drive speed.

To provide a controller for such a vibration actuator, devices including a device for shifting the drive frequency that is the frequency of drive voltage and a device for changing the pulse width (a control parameter of drive voltage) have been developed.

The following describes drive frequency and pulse width with reference to FIG. 13.

FIG. 13 illustrates a configuration of a drive circuit of the vibration actuator described above. Reference numeral 200 indicates a vibration actuator. Reference numeral 111 indicates a vibration actuator controller (microcomputer unit) such as a microcomputer, configured to control the vibration actuator. In the following, the vibration actuator controller is also referred to as the microcomputer unit.

Reference numeral 10A indicates an oscillator and switching voltage generator for generating an alternating-current voltage (an alternating current signal) that causes vibrations of a first mode (A mode) in accordance with a command value from the microcomputer unit 111 (vibration actuator controller). Reference numeral 10B indicates an oscillator and switching voltage generator for generating an alternating-current voltage (an alternating current signal) that causes vibrations of a second mode (B mode) in accordance with a command value from the microcomputer unit 111 (vibration actuator controller).

The oscillator can change the phase difference between the alternating-current voltage (alternating current signal) that causes vibrations of the A mode and the alternating-current voltage (alternating current signal) that causes vibrations of the B mode (hereinafter also simply referred to as phase difference) by 0 to 360°.

The switching voltage generator 10A is a portion of a unit for generating the alternating-current voltage (alternating current signal) that causes vibrations of the A mode. Specifically, the switching voltage generator 10A is a switching circuit (unit) for providing switching for the voltage from a power supply (Vbat) by using field-effect transistors (FETs) 11 to 41 serving as switching elements. A voltage (a switching voltage) generated by the switching voltage generator 10A is amplified by the combination of a coil 61 and a capacitor 62 providing the step-up effect. The amplified voltage is applied to an A-mode drive terminal of the vibration actuator.

The switching voltage generator 10B is a portion of a unit for generating the alternating-current voltage (alternating current signal) that causes vibrations of the B mode. Specifically, the switching voltage generator 10A is a switching circuit (unit) for providing switching for the voltage from the power supply (Vbat) by using field-effect transistors (FETs) 12 to 42 serving as switching elements. A voltage (a switching voltage) generated by the switching voltage generator 10B is amplified by the combination of a coil 71 and a capacitor 72 providing the step-up effect. The amplified voltage is applied to a B-mode drive terminal of the vibration actuator.

Reference numeral 14 indicates a supply voltage detection circuit that measures the level of the voltage from the power supply Vbat. The power supply Vbat is coupled to the switching voltage generators. By providing switching for the voltage from the power supply Vbat, a switching pulse (a pulse signal) is generated.

As used herein, "drive frequency" refers to frequencies (frequencies of a plurality of kinds of pulse signals) generated when the switching circuits provides switching for the voltage from the power supply (Vbat). In the following, control of changing the drive speed by changing this drive frequency is referred to as frequency control.

Switching is provided for the voltage from the power supply (Vbat) by the switching circuit, and the voltage after switching is outputted as switching pulses (a plurality of kinds of pulse signals) from A1, A2, B1, and B2 in FIG. 13.

The pulse width denotes a time width of the switching pulse (pulse signal). When the ratio of the time width in an on-state to the time width in an off-state is 1:1, the duty ratio is 0.50 (50%); when the ratio of the time width in an on-state to the time width in an off-state is 1:3, the duty ratio is 0.25 (25%). In the following, control of changing the drive speed by changing the pulse width is referred to as pulse width control.

Reference numeral 8 indicates a unit for calculating the phase difference between the applied voltage and the detected voltage to monitor resonance, provided in the vibration actuator.

A position detection unit 13 is a position detection unit for detecting the rotation position of a rotator constituted by, for example, a photo-interrupter and a slit plate. Based on the result obtained by this position detection unit 13, the positional information and speed information of the rotator is transmitted to the microcomputer unit 111 (vibration actuator controller). Based on these kinds of information, the microcomputer unit 111 (vibration actuator controller) controls the rotation position (drive position) and rotation speed (drive speed) of the vibration actuator.

For drive control, Japanese Patent Laid-Open No. 2019-198199 uses a method in which control with pulse width is provided for a low-speed region (pulse width control), and control with drive frequency is provided for a high-speed region (frequency control).

Japanese Patent Laid-Open No. 2018-133873 uses a method in which frequency control is provided for a speed-up region, and pulse width control is provided for a constant-speed region. Japanese Patent Laid-Open No. 2018-133873 explains that when the pulse width is limited within a predetermined set range in pulse width control for a constant-speed region, the frequency of alternating current signal is shifted to limit the pulse width within the set range, so that stable control is provided.

In FIGS. 14 and 15, solid lines represent plots of drive parameters (frequency and pulse width) of a vibration actuator under a predetermined condition versus speed. In FIG. 14, the horizontal axis indicates frequency, and the vertical axis indicates speed. In FIG. 15, the horizontal axis indicates pulse width at a drive frequency $fs_0$, and the vertical axis indicates speed at the drive frequency $fs_0$. In FIG. 14, Nmax is a maximum speed. In FIGS. 14 and 15, Np is a speed (a switching speed) at which control switches from pulse width control to frequency control.

FIG. 16 illustrates control operation of a known vibration driving device in pulse width control. The horizontal axis indicates time, and the vertical axis indicates speed, frequency, and pulse width.

FIG. 17 illustrates control operation of the known vibration driving device in frequency control. The horizontal axis indicates time, and the vertical axis indicates speed, frequency, and pulse width.

When the vibration actuator starts operating, firstly, the pulse width is gradually increased at the preset drive frequency $fs_0$, and the speed is in response increased as seen in FIG. 14. When a pulse width PW0, with which control is switched from pulse width control to frequency control, is reached, the speed reaches a switching speed Np. At the switching speed Np or lower, driving is performed in pulse width control. To increase the speed above the switching speed Np, frequency control for increasing speed with the help of drive frequency, which is illustrated in FIG. 14, is provided.

The following describes operations when driving is performed at the switching speed Np or lower, with reference to FIG. 16. As the pulse width is gradually increased at the preset drive frequency $fs_0$, the speed is also increased (a region (1) in FIG. 16). When the speed reaches a speed Nv that is a target speed, pulse width control starts; in pulse width control, the pulse width is increased or decreased in accordance with the difference between the detected speed and the target speed (speed deviation) (a region (2) in FIG. 16). As illustrated in FIG. 15, pulse width control starts with about a pulse width PWv1. To stop at a target position, in reverse of the previous operation, the pulse width is decreased so that the speed is reduced (a region (3) in FIG. 16); when the target position is close, the pulse width is decreased to zero; as a result, stop operation is performed (a region (4) in FIG. 16), which is the normal operation.

The following describes operations when driving is performed at a speed higher than the switching speed Np, with reference to FIG. 17. Firstly, the pulse width is gradually increased at the preset drive frequency $fs_0$; as seen in FIG. 17, the speed is also increased; when the pulse width reaches the pulse width PW0, with which control is switched to frequency control, the speed reaches the switching speed Np. To increase the speed above the switching speed Np, frequency control for increasing speed with the help of frequency, which is illustrated in FIG. 17, is provided. In the range of frequency control, the speed is increased by lowering the drive frequency. After the pulse width is increased to the pulse width maximum value PW0, while maintaining PW0, the frequency is decreased. When the speed reaches the speed Nv as a target speed, frequency control is provided; in frequency control, the frequency is increased or decreased in accordance with the difference between the target speed Nv and the detected speed. To stop at a target position, in reverse of the previous operation, the frequency is increased so that the speed is reduced; control is then switched to pulse width control, and the pulse width is decreased; as a result, stop operation is performed, which is the normal operation.

However, during the operations described above, when environmental parameters (for example, temperature and load torque) are changed, the relationship between frequency and speed (frequency characteristic) deviates as represented by a dotted line in FIG. 14.

In the pulse width control region, as illustrated in FIG. 15, a slope P1 changes to a dotted line of a slope P2; pulse width control, which is originally provided with about the pulse width PWv1, is provided with about a pulse width PWv2. When the inclination is increased as the slope P2, the speed is increased or decreased more in response to changes in pulse width; as a result, a problem arises in which, when a given pulse width is changed, an increased change in speed occurs, and sudden speed change or vibration may be effected.

Conversely, in the frequency control region, increases or decreases in speed do not change in response to changes in frequency as illustrated in FIG. 14, sudden speed change or vibration is not effected. This means that when environmental parameters (for example, temperature and load torque) are changed, it is necessary to provide some adjustment for this change in the pulse width control region. In known technologies, a mathematical expression is developed to calculate the degree of frequency change in the relationship between frequency and speed with respect to temperature and load torque; based on the degree of change in temperature and load torque detected by sensors, the degree of frequency change is calculated, and the start frequency is accordingly adjusted.

This method, however, needs sensors, which causes increase in device size and costs. Further, if the frequency change is non-linear with respect to temperature and load, developing a mathematical expression is difficult.

SUMMARY

In consideration of these circumstances, the present disclosure provides a vibration actuator controller configured to suppress changes in control characteristics due to changes in the frequency characteristic.

A vibration actuator controller of the present disclosure controller is configured to control a vibration actuator that includes a vibrating member having an electromechanical energy conversion element and that includes a contact member in contact with the vibrating member. The contact member is configured to move relative to the vibrating member in response to a plurality of pulse signals. The vibration actuator controller includes a processor configured to control a relative movement speed, which is a speed at which the contact member moves relative to the vibrating member, by changing a pulse width of the plurality of pulse signals while maintaining a frequency of the plurality of pulse signals. When the relative movement speed is controlled, the frequency is shifted such that the pulse width and the relative movement speed satisfy a predetermined relationship.

Another vibration actuator controller of the present disclosure is configured to control a vibration actuator that includes a vibrating member having an electromechanical energy conversion element and that includes a contact member in contact with the vibrating member. The contact member is configured to move relative to the vibrating member in response to a plurality of pulse signals. The vibration actuator controller includes a processor configured to control a relative movement speed, which is a speed at which the contact member moves relative to the vibrating member, by changing a phase difference of the plurality of pulse signals while maintaining a frequency of the plurality of pulse signals. When the relative movement speed is controlled, the frequency is shifted such that the phase difference and the relative movement speed satisfy a predetermined relationship.

Further features of the present disclosure will become apparent from the following description of exemplary embodiments with reference to the attached drawings.

BRIEF DESCRIPTION OF THE DRAWINGS

FIG. 4 is a flowchart illustrating an algorithm of the first embodiment.

FIG. 5 is a table indicating relationships among speed, pulse width, pulse width upper limit value, and pulse width lower limit value, according to the first embodiment.

FIG. 9 is a flowchart illustrating an algorithm of the second embodiment.

DESCRIPTION OF THE EMBODIMENTS

First Embodiment

The following describes this embodiment (first embodiment) with reference to FIGS. 1A to 5.

Figure 1A:
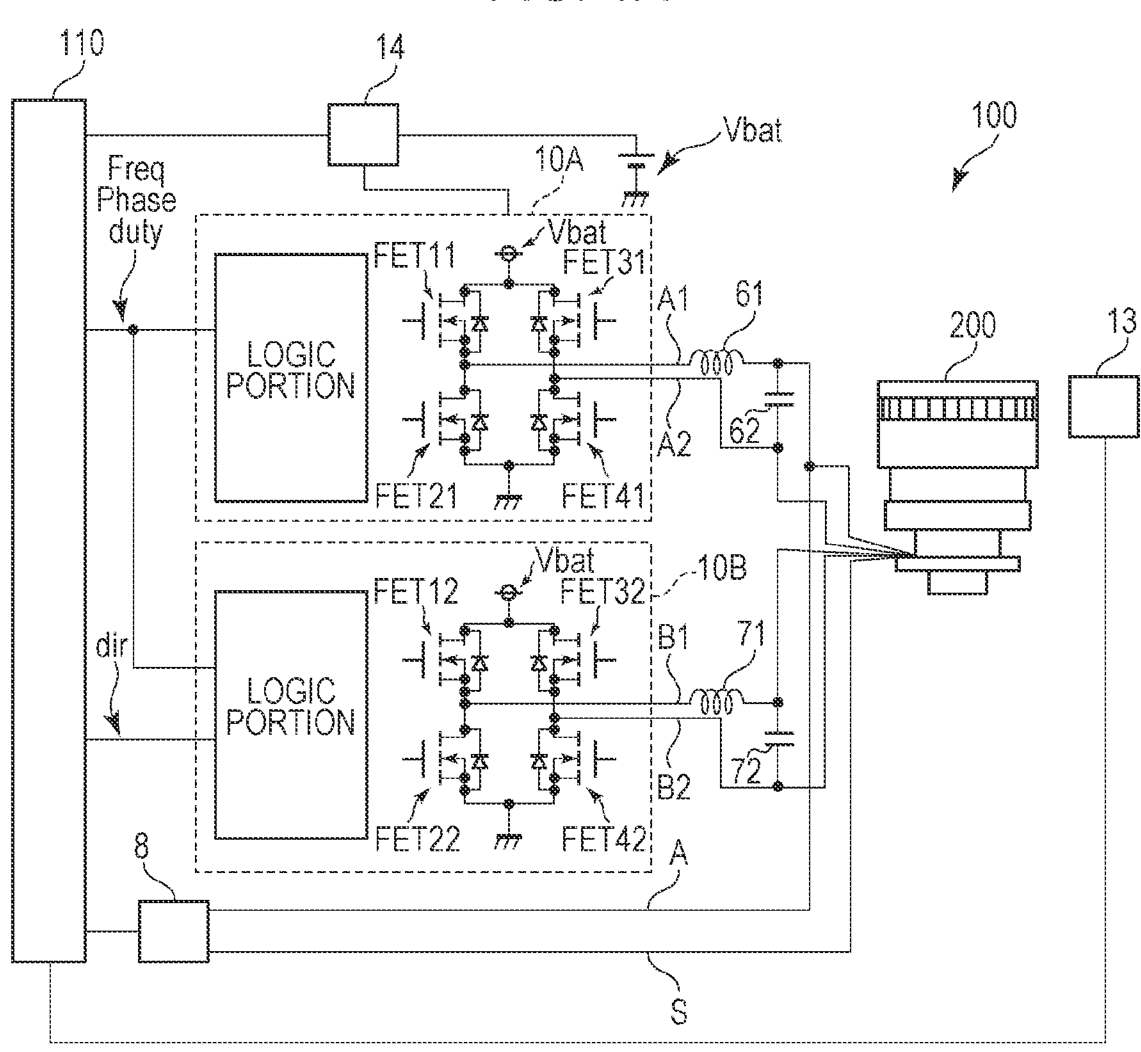
FIG. 1A illustrates components forming a vibration driving device, including a vibration actuator and a vibration actuator control circuit (a vibration actuator controller) of the present disclosure.

FIG. 1A illustrates components forming a vibration driving device, including a vibration actuator and a vibration actuator control circuit (a vibration actuator controller) of the present disclosure.

Figure 13:
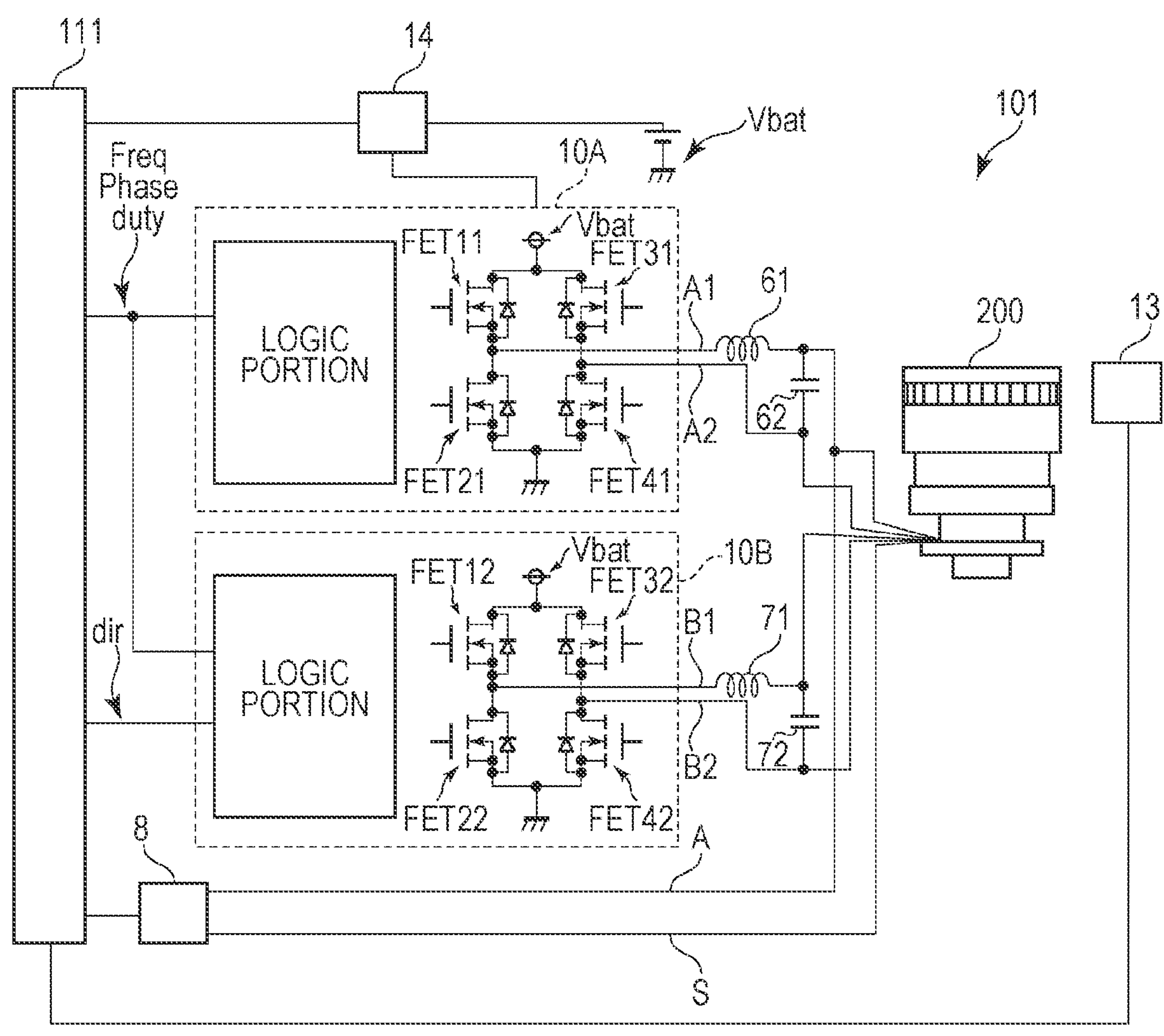
FIG. 13 illustrates components forming a vibration driving device, including a vibration actuator and a known vibration actuator control circuit (a vibration actuator controller).

The configuration of the vibration driving device 100 is the same as the configuration of a vibration driving device 101 in FIG. 13 except for a microcomputer unit 110 (a vibration actuator controller).

Figure 1B:
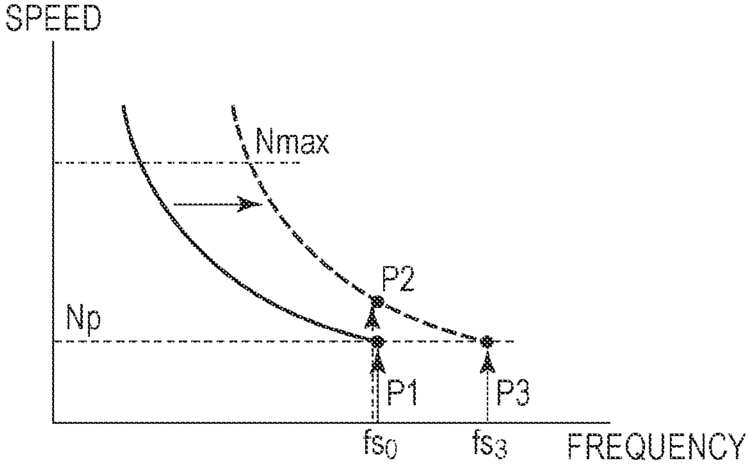
FIG. 1B illustrates a plot of frequency versus speed in the vibration driving device of a first embodiment.
Figure 2:
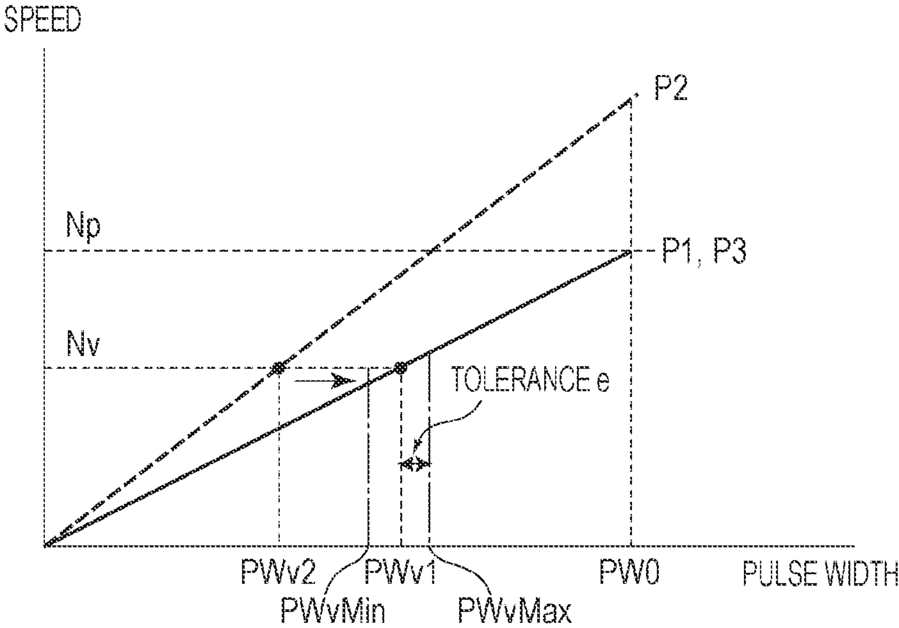
FIG. 2 illustrates a plot of pulse width versus speed in the vibration driving device of the first embodiment.

FIGS. 1B and 2 illustrate a method of dealing with changes in environmental parameters with a vibration actuator controller of this embodiment (first embodiment).

FIG. 1B illustrates a plot of frequency versus speed (frequency characteristic). FIG. 2 illustrates a plot of pulse width versus speed (pulse width characteristic). In FIG. 1B, $fs_0$ is a start frequency.

Here, P1 indicates the pulse width characteristic when the solid line represents the frequency characteristic, and the drive frequency is $fs_0$. P2 indicates the pulse width characteristic when the dotted line represents the frequency characteristic, and the drive frequency is $fs_0$. P3 indicates the pulse width characteristic when the dotted line represents the frequency characteristic, and the drive frequency is $fs_3$.

Figure 14:
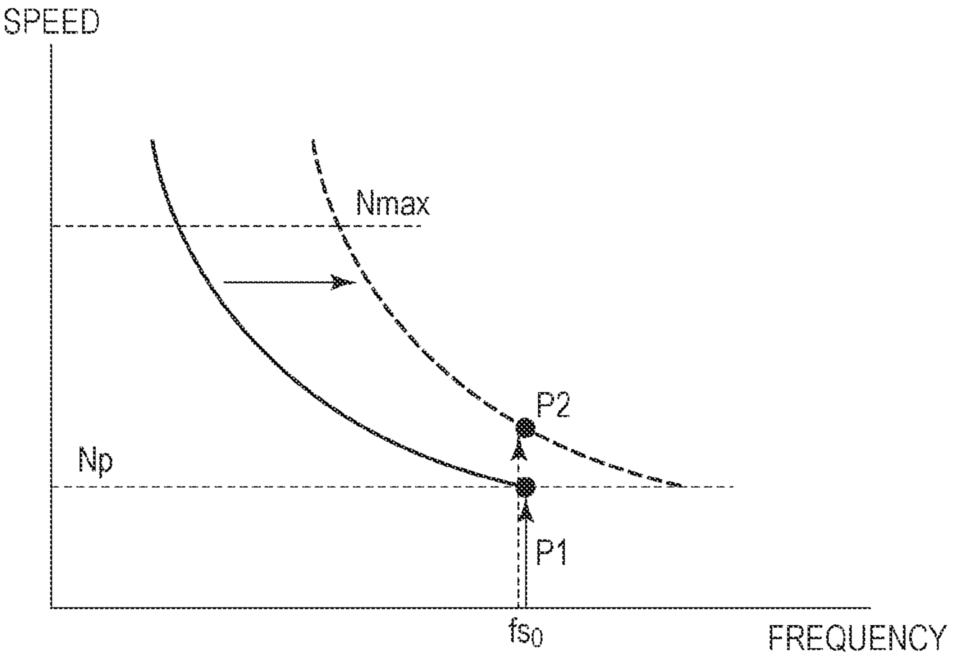
FIG. 14 illustrates a plot of frequency versus speed in a known vibration driving device.
Figure 15:
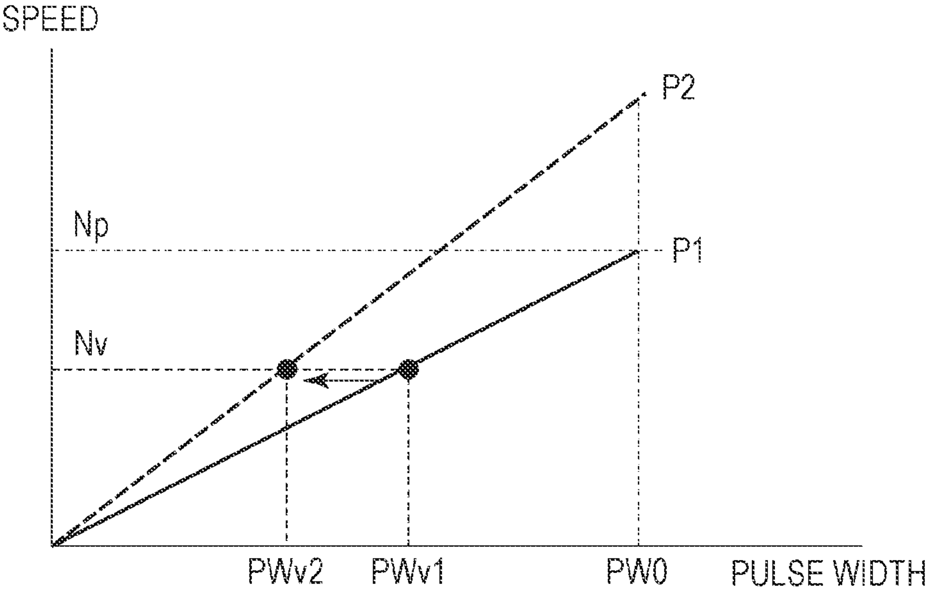
FIG. 15 illustrates a plot of pulse width versus speed in the known vibration driving device.
Figure 16:
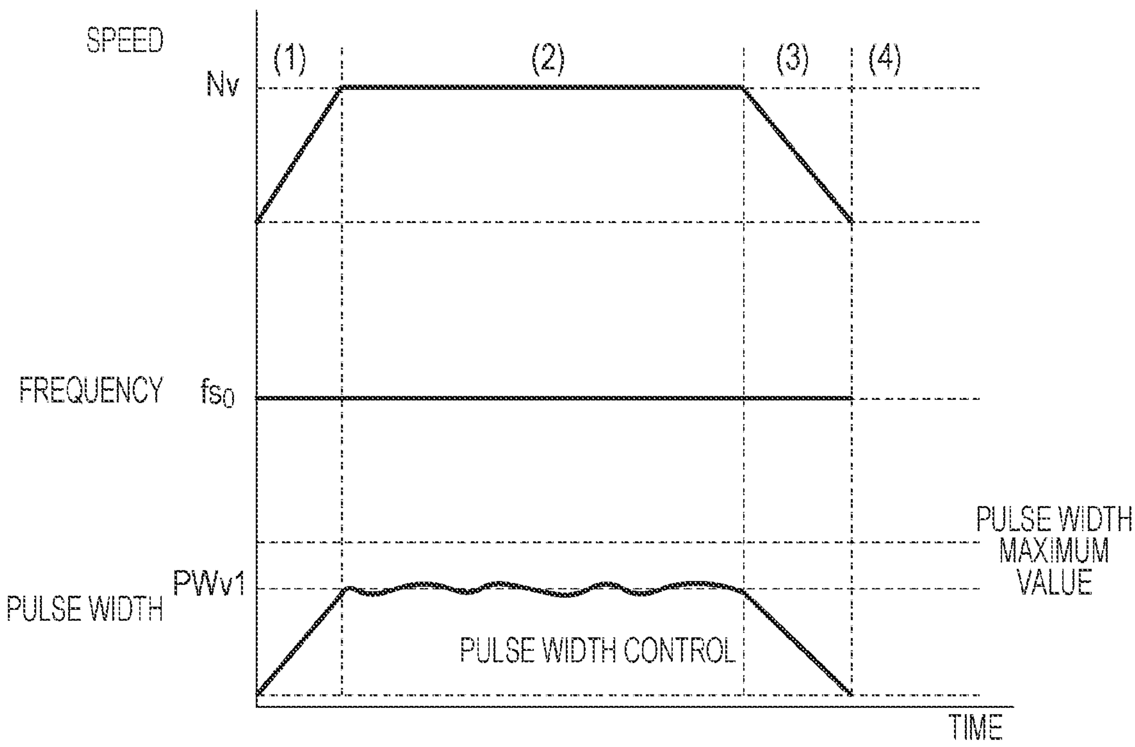
FIG. 16 illustrates plots of speed, frequency, and pulse width versus time in the known vibration driving device under pulse width control.
Figure 17:
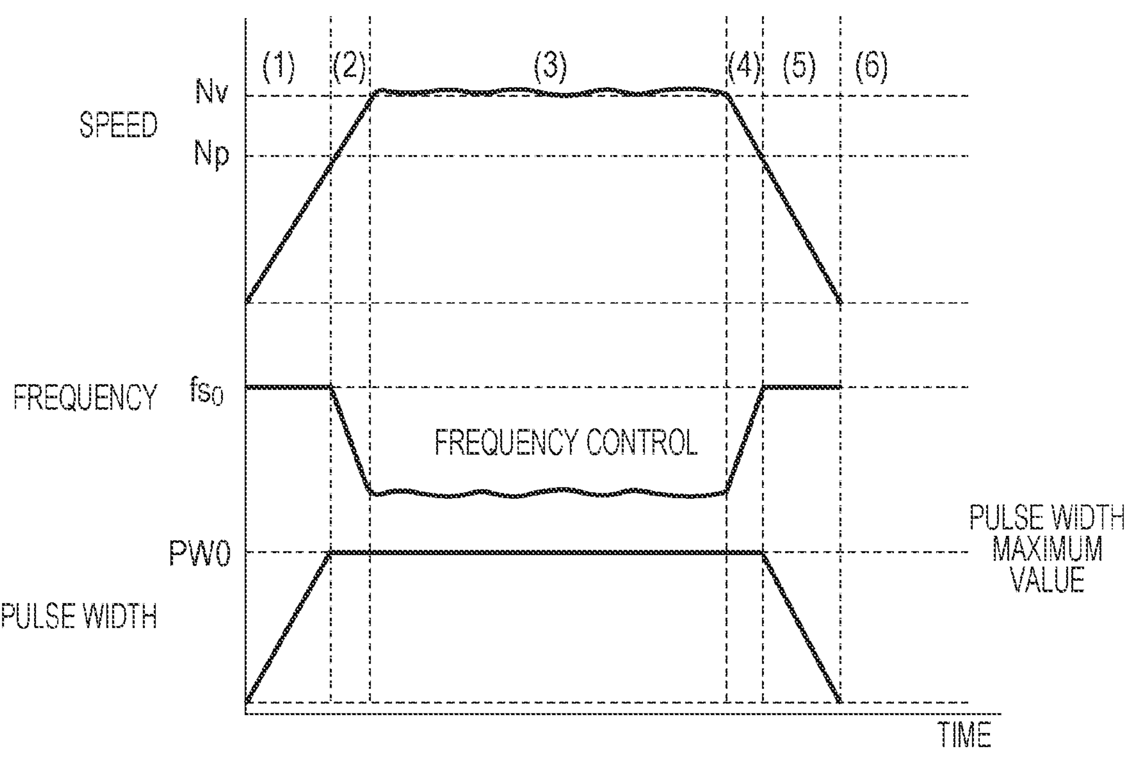
FIG. 17 illustrates plots of speed, frequency, and pulse width versus time in the known vibration driving device under frequency control.

The change from P1 to P2 due to changes in environmental parameters is the same as in FIG. 14.

As illustrated in FIG. 1B, in the case in which the frequency characteristic is shifted from the solid line to the dotted line, when the drive frequency for pulse width control is shifted from $fs_0$ to $fs_3$, the plot of pulse width versus speed in FIG. 2 is changed from the slope P2 to the slope P3. The slope P3 is almost the same as the slope P1 before changes in environmental parameters; when driving is performed at the speed Nv, pulse width control is provided with about the pulse width PWv1.

As a result, after environmental parameters are changed, driving is started at the speed Nv with the drive frequency $fs_0$, and pulse width control is firstly provided with about a pulse width PWv2.

During pulse width control, for the purpose of causing the pulse width to be within a tolerance with respect to the pulse width PWv1, the drive frequency is shifted from $fs_0$ to $fs_3$. Consequently, pulse width control is provided at the drive frequency $fs_3$ with about the pulse width PWv1. This means that when the frequency characteristic changes due to changes in environmental parameters, the same control as in a preset environment (under a standard condition) can be provided by shifting the drive frequency from $fs_0$ to $fs_3$.

In this embodiment (first embodiment), a shift unit (an adjustment unit) for shifting from $fs_0$ to $fs_3$ is provided. This embodiment (first embodiment) will be described with reference to FIGS. 3 and 4. Firstly, the following describes operations performed when pulse width control is provided in a low-speed region in which the target speed is equal to or lower than the switching speed Np.

Figure 3:
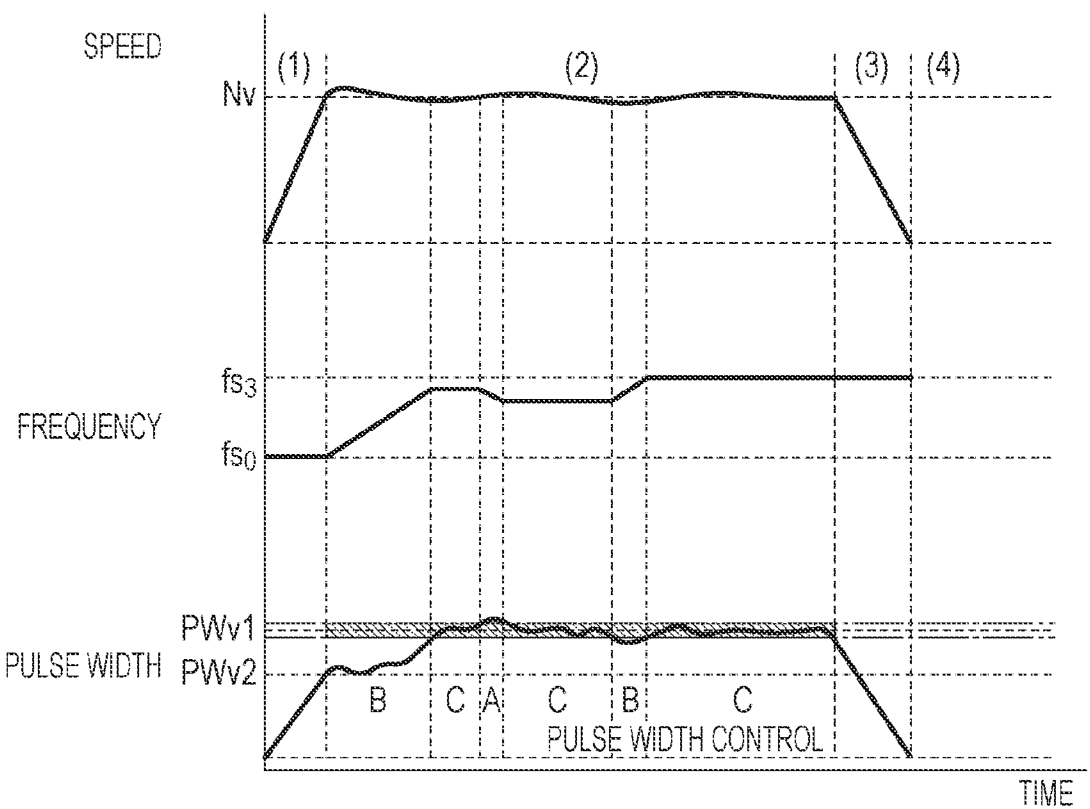
FIG. 3 illustrates plots of speed, frequency, and pulse width versus time in the vibration driving device of the first embodiment.

FIG. 3 illustrates operations for adjusting the drive frequency to $fs_3$ by shifting the drive frequency for the purpose of achieving a pulse width that enables a vibration actuator control operation of the vibration actuator controller according to the present disclosure and that satisfies a predetermined relationship between speed and pulse width. FIG. 3 illustrates plots of vibration actuator speed, drive voltage frequency (drive frequency), and pulse width versus time. The horizontal axis indicates time, and the vertical axis indicates vibration actuator speed, drive voltage frequency (drive frequency), and pulse width.

FIG. 4 is a flowchart illustrating a method for controlling the vibration actuator 200, according to this embodiment (first embodiment). Operations indicated in the flowchart in FIG. 4 are implemented by the microcomputer unit (vibration actuator controller) running a particular program stored in the microcomputer unit (vibration actuator controller) to control operations of the individual units constituting the control circuit.

A drive algorithm starts.

In step S101, a target speed of the vibration actuator 200 is specified.

In step S102, based on the target speed specified in step S101, a pulse width (an optimum pulse width) satisfying a predetermined relationship between speed and pulse width is calculated.

The following describes a method of recording a predetermined relationship (before changes in environmental parameters) between speed and pulse width and a method of calculating a pulse width in accordance with the relationship.

As used herein, "speed" refers to relative movement speed with respect to a vibrating member 220 and the mover 207 (contact member) as a driven member. More specifically, "speed" refers to the rotation speed of the mover 207 (contact member) relative to the vibrating member 220. The term "speed" may refer to the movement speed or rotation speed of a drive target object connected to the gear 209.

The characteristic of the slope P1 in FIG. 2 represents a predetermined relationship between speed and pulse width, more specifically, a relationship between speed and pulse width in a preset environment (under a standard condition). This characteristic can be obtained by measuring a pulse width PWv when driving is performed in pulse width control for a given distance at a speed Nx under the standard condition.

As indicated in FIG. 5, a relationship between speed and pulse width under the standard condition can be obtained.

This relationship is recorded with respect to individual speeds as table information in a memory. Alternatively, a relationship between speed and pulse width under the standard condition may be expressed as a mathematical expression; when a speed is specified, a pulse width under the standard condition may be given by a polynomial expression $y=ax+b$. The mathematical expression may be, for example, $y=0.3x+30$. As indicated in FIG. 5, the pulse width PWv is calculated with respect to the speed Nv. When the mathematical expression is used, the mathematical expression is recorded; based on the target speed, a pulse width under the standard condition is calculated. The operation of recording is performed before start of driving.

In step S103, based on the pulse width (optimum pulse width) calculated in step S102, a pulse width upper limit value and a pulse width lower limit value are calculated. The pulse width upper limit value is obtained by adding a tolerance e to the value of the calculated pulse width (optimum pulse width). The pulse width lower limit value is obtained by subtracting the tolerance e from the value of the calculated pulse width (optimum pulse width).

The tolerance e between the pulse width calculated in step S102 and the pulse width upper limit value may be different from the tolerance e between the pulse width calculated in step S102 and the pulse width lower limit value. The pulse width upper limit value and pulse width lower limit value may be calculated by multiplying the pulse width calculated in step S102 by a coefficient (a tolerance coefficient). For example, given that a tolerance coefficient is 1.2, the pulse width upper limit value is given by PWv×1.2; given that a tolerance coefficient is 0.9, the pulse width lower limit value is given by PWv×0.9. In such as manner, the tolerance e between the pulse width calculated in step S102 and the pulse width upper limit value can be made different from the tolerance e between the pulse width calculated in step S102 and the pulse width lower limit value.

The pulse width upper limit values and pulse width lower limit values in FIG. 5 are an example calculated with an error rate of 5% based on pulse widths under the standard condition. The error rate is not limited to 5%, and may be any percentage.

In step S104, the microcomputer unit (vibration actuator controller) sets the drive frequency at the start frequency $fs_0$, which is a predetermined drive frequency. Additionally, the microcomputer unit (vibration actuator controller) sets the pulse width at 0%. By starting applying drive signals (drive voltages) A1, B1, A2, and B2 to the piezoelectric element 202 (electromechanical energy conversion element), the vibration actuator 200 starts operating.

In step S105, the pulse width is gradually increased to cause the vibration actuator 200 to smoothly start operating.

In step S106, when comparison between the pulse width and a pulse width maximum value PW0 indicates that the pulse width is smaller than the pulse width maximum value PW0, YES is determined, and the process moves to step S107. In step S106, when the pulse width is equal to or greater than the pulse width maximum value PW0, NO is determined, and the process moves to step S117.

In step S107, when comparison between a detected speed and a target speed indicates that the detected speed is lower than the target speed, the process returns to step S105, and the pulse width is increased. The operations in steps S104 to S107 are illustrated in a region (1) in FIG. 3. In step S107, when the detected speed is equal to or higher than the target speed, YES is determined, and the process moves to step S108.

In step S108, during the operation after the detected speed reaches the target speed, the pulse width is increased or decreased in accordance with the difference between a detected speed and the target speed (speed deviation). The same operation can be achieved by increasing or decreasing the pulse width in accordance with the difference between a detected position and a target position (position deviation). This operation (pulse width control) is illustrated in a region (2) in FIG. 3.

In step S109, the pulse width is compared with a pulse width upper limit value. When the pulse width is above the pulse width upper limit value, YES is determined, and the process moves to step S110.

In step S110, the drive frequency is decreased by one step (the drive frequency is shifted). Subsequently, the process returns to step S108. This operation is illustrated in A of the region (2) in FIG. 3. As used herein, the term "one step" refers to a preset magnitude of shift (a unit for shifting the drive frequency). For example, "one step" can be a magnitude equal to or higher than a 1 Hz frequency.

In step S109, when the pulse width is not above the pulse width upper limit value, NO is determined, and the process moves to step S111.

In step S111, the pulse width is compared with a pulse width lower limit value. When the pulse width is below the pulse width upper lower value, YES is determined, and the process moves to step S112. In step S112, the drive frequency is increased by one step (the drive frequency is shifted).

Subsequently, the process returns to step S108. This operation is illustrated in B of the region (2) in FIG. 3.

In step S111, when the pulse width is not below the pulse width lower limit value, NO is determined, and the process moves to step S113.

In step S113, when a speed reduction start position is not reached, NO is determined, and the process returns to step S108. In the operation from step S113 to step S108, the pulse width is changed, but the drive frequency is not changed (the drive frequency is maintained). This operation is illustrated in C of the region (2) in FIG. 3.

In step S113, when the speed reduction start position is reached, YES is determined, and the process moves to step S114.

In step S114, the pulse width is gradually decreased, and the speed is reduced. Subsequently, the process moves to step S115.

In step S115, it is determined whether the stop position is reached; when the stop position is not reached, NO is determined, and the operation of decreasing the pulse width and reducing the speed in step S114 is continued. In step S115, when the stop position is reached, YES is determined, and the process moves to step S116. The operations in steps S114 to S115 are illustrated in a region (3) in FIG. 3.

In step S116, application of the drive voltage is stopped. As a result, the vibration actuator 200 enters a stop state, and this process ends. This stop state is illustrated in a region (4) in FIG. 3.

Secondly, the following describes operations performed when frequency control is provided in a high-speed region in which the target speed is equal to or higher than the switching speed Np. In this case, when the pulse width reaches the pulse width maximum value PW0, the target speed is not reached; thus, while the pulse width is maintained at the pulse width maximum value PW0, the frequency is decreased. After the target speed is reached, frequency control is provided in which frequency is increased or decreased in accordance with the difference to the target speed. In this case, changing (adjusting) the drive frequency in pulse width control of this embodiment (first embodiment) (the operations in steps S109 to S112) is not performed.

In this embodiment (first embodiment), by performing the operations in steps S109 to S112, while the speed is maintained, the drive frequency is repeatedly shifted so that the pulse width reaches the pulse width PWv1. As a result, the drive frequency is adjusted to $fs_3$, thereby enabling almost the same control before environmental parameters are changed.

In this embodiment (first embodiment), the operations in steps S109 to S112 are performed in the section after the target speed is reached and before the speed reduction start position is reached; however, the operations in steps S109 to S112 may be performed in the region (1) in FIG. 3 before the target speed is reached or the region (3) in FIG. 3 that is a speed reduction section.

In this embodiment (first embodiment), an upper limit value and a lower limit value are set based on a specified target speed, but an upper limit value and a lower limit value may be set based on a detected speed.

In this embodiment (first embodiment), a combination of frequency control and pulse width control is used, but the same effect can be achieved with voltage control of changing voltage subjected to switching, instead of pulse width control.

Second Embodiment

The following describes this embodiment (second embodiment) with reference to FIGS. 6 to 9.

In the first embodiment, the speed is changed by changing the pulse width at the timings of start and end, but in this embodiment (second embodiment), the speed is changed by changing a phase difference (AB phase difference) between a drive voltage causing the A mode and a drive voltage causing the B mode. An operation of controlling speed based on speed deviation using the AB phase difference is referred to as AB phase difference control. In the following, AB phase difference control is also simply referred to as "phase difference control".

Figure 6:
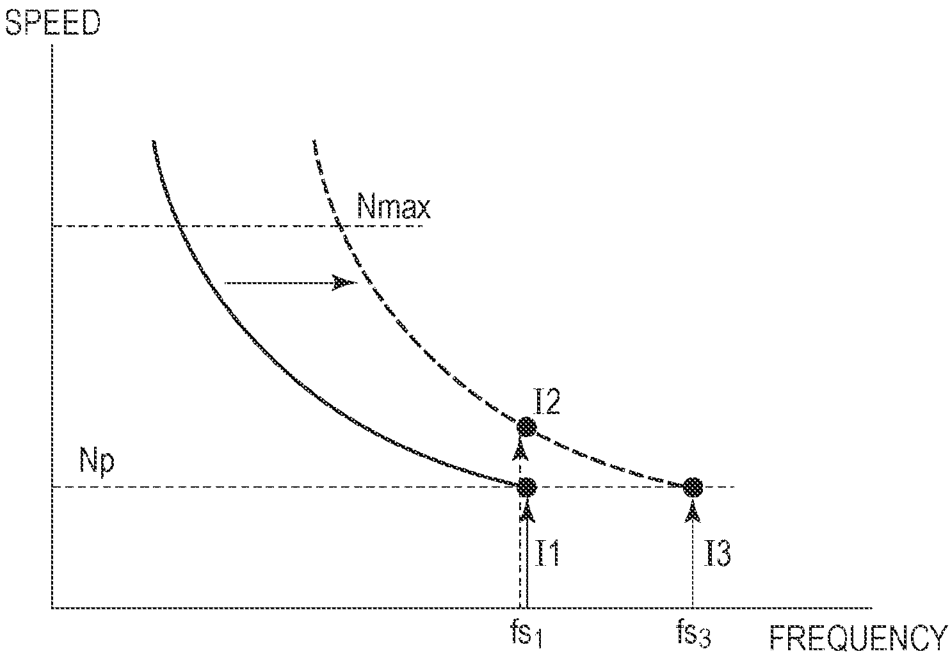
FIG. 6 illustrates a plot of frequency versus speed in a vibration driving device of a second embodiment.
Figure 7:
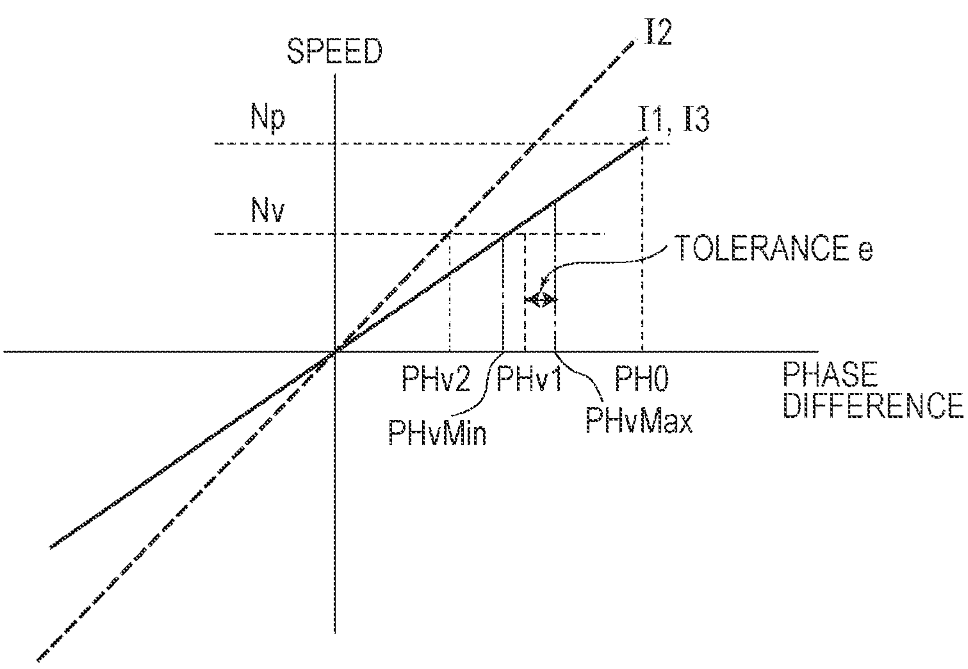
FIG. 7 illustrates a plot of phase difference versus speed in the vibration driving device of the second embodiment.

FIGS. 6 and 7 illustrate a method of dealing with changes in environmental parameters with a vibration actuator controller of this embodiment (second embodiment).

FIG. 6 illustrates a plot of frequency versus speed (frequency characteristic). FIG. 7 illustrates a plot of AB phase difference control versus speed (phase difference characteristic). In FIG. 6, $fs_1$ is a start frequency.

The relationship between phase difference and drive direction depends on the configuration of vibration actuator. In the relationship between phase difference and drive direction of this embodiment (second embodiment), as the phase difference increases in the plus direction, the speed in the forward direction increases; as the phase difference increases in the minus direction, the speed in the reverse direction increases.

Here, I1 indicates the phase difference characteristic when the solid line represents the frequency characteristic, and the drive frequency is $fs_1$. I2 indicates the phase difference characteristic when the dotted line represents the frequency characteristic, and the drive frequency is $fs_1$. I3 indicates the phase difference characteristic when the dotted line represents the frequency characteristic, and the drive frequency is $fs_3$.

Similarly to the first embodiment, when the frequency characteristic changes due to changes in environmental parameters, the phase difference characteristic is changed to I2. As a result, if the slope of the plot of phase difference versus speed largely changes, for example, an oscillation phenomenon is effected. For this reason, it is necessary to change the start frequency to $fs_3$ so that the characteristic I3 almost identical to I1 can be achieved. In this embodiment, by changing the phase difference while maintaining a particular pulse width, the operation of controlling speed in a low-speed condition is performed in the similar manner to the first embodiment.

As illustrated in FIG. 6, in the case in which the frequency characteristic is shifted from the solid line to the dotted line, when the drive frequency for phase difference control is shifted from $fs_1$ to $fs_3$, the plot of phase difference versus speed in FIG. 7 is changed from the slope I2 to the slope I3. The slope I3 is almost the same as the slope I1 before changes in environmental parameters; when driving is performed at a speed Np, phase difference control is provided with about a phase difference PHv1.

As a result, after environmental parameters are changed, driving is started at the speed Np with the drive frequency $fs_1$, and phase difference control is firstly provided with about a phase difference PHv2.

During phase difference control, for the purpose of causing the phase difference to be within a tolerance with respect to the phase difference PHv1, the drive frequency is shifted from $fs_1$ to $fs_3$. Consequently, phase difference control is provided at the drive frequency $fs_3$ with about the phase difference PHv1. This means that when the frequency characteristic changes due to changes in environmental parameters, the same control as in a preset environment (under a standard condition) can be provided by shifting the drive frequency from $fs_1$ to $fs_3$.

In this embodiment (second embodiment), a shift unit (an adjustment unit) for shifting from $fs_1$ to $fs_3$ is provided. This embodiment (second embodiment) will be described with reference to FIGS. 8 and 9. Firstly, the following describes operations performed when phase difference control is provided in a low-speed region in which the target speed is equal to or lower than the switching speed Np.

Figure 8:
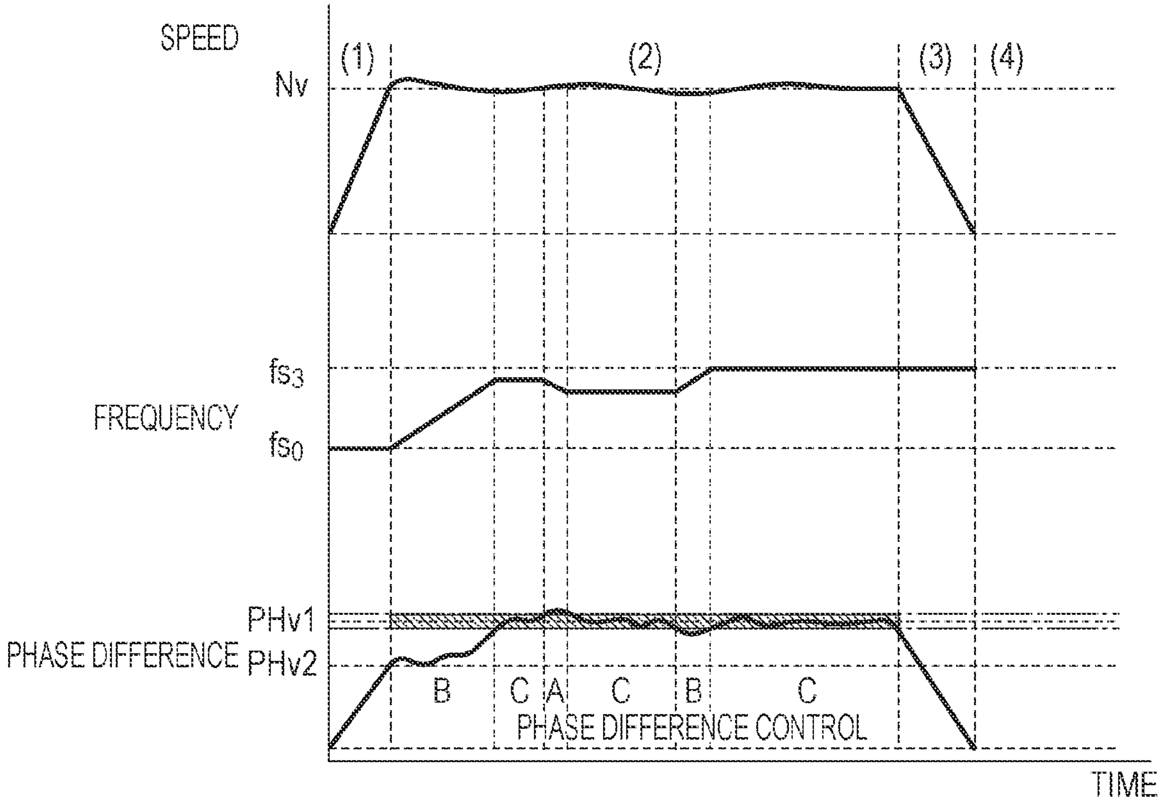
FIG. 8 illustrates plots of speed, frequency, and phase difference versus time in the vibration driving device of the second embodiment.

FIG. 8 illustrates operations for adjusting the drive frequency to $fs_3$ by shifting the drive frequency for the purpose of achieving a phase difference that enables a vibration actuator control operation of the vibration actuator controller according to the present disclosure and that satisfies a predetermined relationship between speed and phase difference. FIG. 8 illustrates plots of vibration actuator speed, drive voltage frequency (drive frequency), and phase difference versus time.

The horizontal axis indicates time, and the vertical axis indicates vibration actuator speed, drive voltage frequency (drive frequency), and phase difference.

Figure 9:
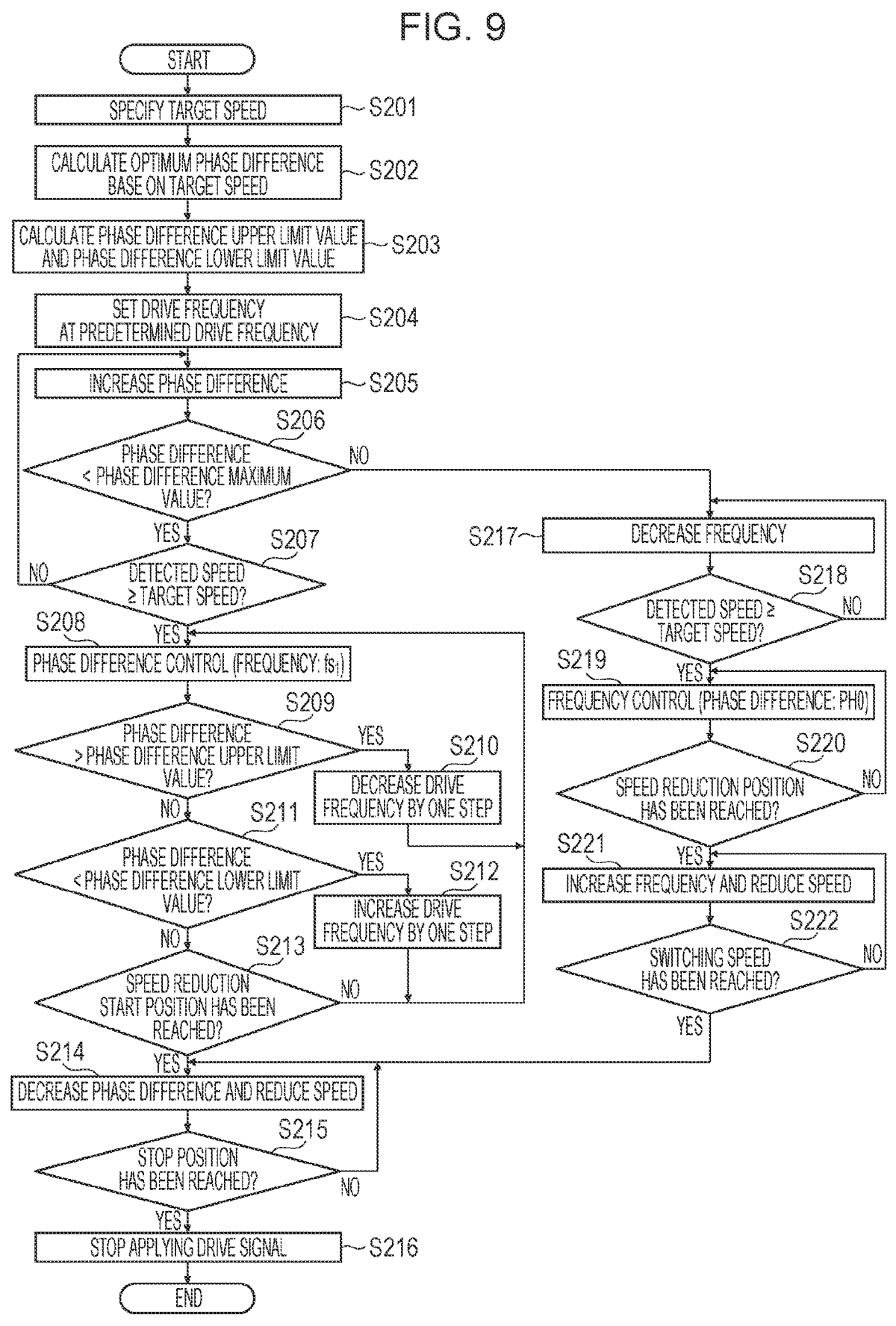

FIG. 9 is a flowchart illustrating a method for controlling the vibration actuator 200, according to this embodiment (second embodiment). Operations indicated in the flowchart in FIG. 9 are implemented by the microcomputer unit (vibration actuator controller) running a particular program stored in the microcomputer unit (vibration actuator controller) to control operations of the individual units constituting the control circuit.

A drive algorithm starts.

In step S201, a target speed of the vibration actuator 200 is specified.

In step S202, based on the target speed specified in step S201, a phase difference (an optimum phase difference) satisfying a relationship between speed and phase difference recorded before changes in environmental parameters is calculated.

The following describes a method of recording a predetermined relationship (before changes in environmental parameters) between speed and phase difference and a method of calculating a phase difference in accordance with the relationship.

As used herein, "speed" refers to relative movement speed with respect to the vibrating member 220 and the mover 207 (contact member) as a driven member. More specifically, "speed" refers to the rotation speed of the mover 207 (contact member) relative to the vibrating member 220. The term "speed" may refer to the movement speed or rotation speed of a drive target object connected to the gear 209.

The characteristic of the slope I1 in FIG. 7 represents a predetermined relationship between speed and phase difference, more specifically, a relationship between speed and phase difference in a preset environment (under a standard condition). This characteristic can be obtained by measuring a phase difference PHv when driving is performed in phase difference control for a given distance at a speed Nv under the standard condition.

This relationship between speed and phase difference under the standard condition is recorded with respect to individual speeds as table information in a memory. Alternatively, a relationship between speed and phase difference under the standard condition may be expressed as a mathematical expression; when a speed is specified, a phase difference under the standard condition may be given by a polynomial expression y=ax+b.

When the mathematical expression is used, the mathematical expression is recorded; based on the target speed, a phase difference under the standard condition is calculated.

The operation of recording is performed before start of driving. In step S203, based on the phase difference (optimum phase difference) calculated in the step S202, a phase difference upper limit value and a phase difference lower limit value are calculated. The phase difference upper limit value is obtained by adding a tolerance e to the value of the phase difference (optimum phase difference). The phase difference lower limit value is obtained by subtracting the tolerance e from the value of the calculated phase difference (optimum phase difference).

The tolerance e between the phase difference calculated in step S202 and the phase difference upper limit value may be different from the tolerance e between the phase difference calculated in step S202 and the phase difference lower limit value. The phase difference upper limit value and phase difference lower limit value may be calculated by multiplying the phase difference calculated in step S202 by a coefficient (a tolerance coefficient). For example, given that a tolerance coefficient is 1.2, the phase difference upper limit value is given by PHv×1.2; given that a tolerance coefficient is 0.9, the phase difference lower limit value is given by PHv×0.9. In such as manner, the tolerance e between the phase difference calculated in step S202 and the phase difference upper limit value can be made different from the tolerance e between the phase difference calculated in step S202 and the phase difference lower limit value.

In step S204, the microcomputer unit (vibration actuator controller) sets the drive frequency at the start frequency $fs_1$, which is a predetermined drive frequency. Additionally, the microcomputer unit (vibration actuator controller) sets the phase difference at 0%. By starting applying drive signals (drive voltages) A1, B1, A2, and B2 to the piezoelectric element 202 (electromechanical energy conversion element), the vibration actuator 200 starts operating.

In step S205, the phase difference is gradually increased to cause the vibration actuator 200 to smoothly start operating.

In step S206, when comparison between the phase difference and a phase difference maximum value PHO indicates that the phase difference is smaller than the phase difference maximum value PHO, YES is determined, and the process moves to step S207. In step S206, when the phase difference is equal to or greater than the phase difference maximum value PHO, NO is determined, and the process moves to step S217.

In step S207, when comparison between a detected speed and a target speed indicates that the detected speed is lower than the target speed, the process returns to step S205, and the phase difference is increased. The operations in steps S204 to S207 are illustrated in a region (1) in FIG. 8. In step S207, when the detected speed is equal to or higher than the target speed, YES is determined, and the process moves to step S208.

In step S208, during the operation after the detected speed reaches the target speed, the phase difference is increased or decreased in accordance with the difference between a detected speed and the target speed (speed deviation). The same operation can be achieved by increasing or decreasing the phase difference in accordance with the difference between a detected position and a target position (position deviation). This operation (phase difference control) is illustrated in a region (2) in FIG. 8.

In step S209, the phase difference is compared with a phase difference upper limit value. Specifically, the absolute value of phase difference is compared to a phase difference upper limit value. When the absolute value of phase difference is above the phase difference upper limit value, YES is determined, and the process moves to step S210.

In step S210, the drive frequency is decreased by one step (the drive frequency is shifted). Subsequently, the process returns to step S208. This operation is illustrated in A of the region (2) in FIG. 8. As used herein, the term "one step" refers to a preset magnitude of shift (a unit for shifting the drive frequency). For example, "one step" can be a magnitude equal to or higher than a 1 Hz frequency.

In step S209, when the absolute value of phase difference is not above the phase difference upper limit value, NO is determined, and the process moves to step S211.

In step S211, the phase difference is compared with a phase difference lower limit value. Specifically, the absolute value of phase difference is compared to a phase difference lower limit value. When the absolute value of phase difference is below the phase difference lower limit value, YES is determined, and the process moves to step S212. In step S212, the drive frequency is increased by one step (the drive frequency is shifted). Subsequently, the process returns to step S208. This operation is illustrated in B of the region (2) in FIG. 8.

In step S211, when the absolute value of phase difference is not below the phase difference lower limit value, NO is determined, and the process moves to step S213.

In step S213, when a speed reduction start position is not reached, NO is determined, and the process returns to step S208. In the operation from step S213 to step S208, the phase difference is changed, but the drive frequency is not changed (the drive frequency is maintained). This operation is illustrated in C of the region (2) in FIG. 8.

In step S213, when the speed reduction start position is reached, YES is determined, and the process moves to step S214.

In step S214, the phase difference is gradually decreased, and the speed is reduced. Subsequently, the process moves to step S215.

In step S215, it is determined whether the stop position is reached; when the stop position is not reached, NO is determined, and the operation of decreasing the phase difference and reducing the speed in step S214 is continued. In step S215, when the stop position is reached, YES is determined, and the process moves to step S216. The operations in steps S214 to S215 are illustrated in a region (3) in FIG. 8.

In step S216, application of the drive voltage is stopped. As a result, the vibration actuator 200 enters a stop state, and this process ends. This stop state is illustrated in a region (4) in FIG. 8.

Secondly, the following describes operations performed when frequency control is provided in a high-speed region in which the target speed is equal to or higher than the switching speed Np. In this case, when the phase difference reaches the phase difference maximum value PHO, the target speed is not reached; thus, while the phase difference is maintained at the phase difference maximum value PHO, the frequency is decreased. After the target speed is reached, frequency control is provided in which frequency is increased or decreased in accordance with the difference to the target speed. In this case, changing (adjusting) the drive frequency in phase difference control of this embodiment (second embodiment) (the operations in steps S209 to S212) is not performed.

In this embodiment (second embodiment), by performing the operations in steps S209 to S212, while the speed is maintained, the drive frequency is repeatedly shifted so that the phase difference reaches the phase difference PHv1. As a result, the drive frequency is adjusted to $fs_3$, thereby enabling almost the same control before environmental parameters are changed.

In this embodiment (second embodiment), the operations in steps S209 to S212 are performed in the section after the target speed is reached and before the speed reduction start position is reached; however, the operations in steps S209 to S212 may be performed in the region (1) in FIG. 8 before the target speed is reached or the region (3) in FIG. 8 that is a speed reduction section.

In this embodiment (second embodiment), an upper limit value and a lower limit value are set based on a specified target speed, but an upper limit value and a lower limit value may be set based on a detected speed.

Third Embodiment

Figure 10:
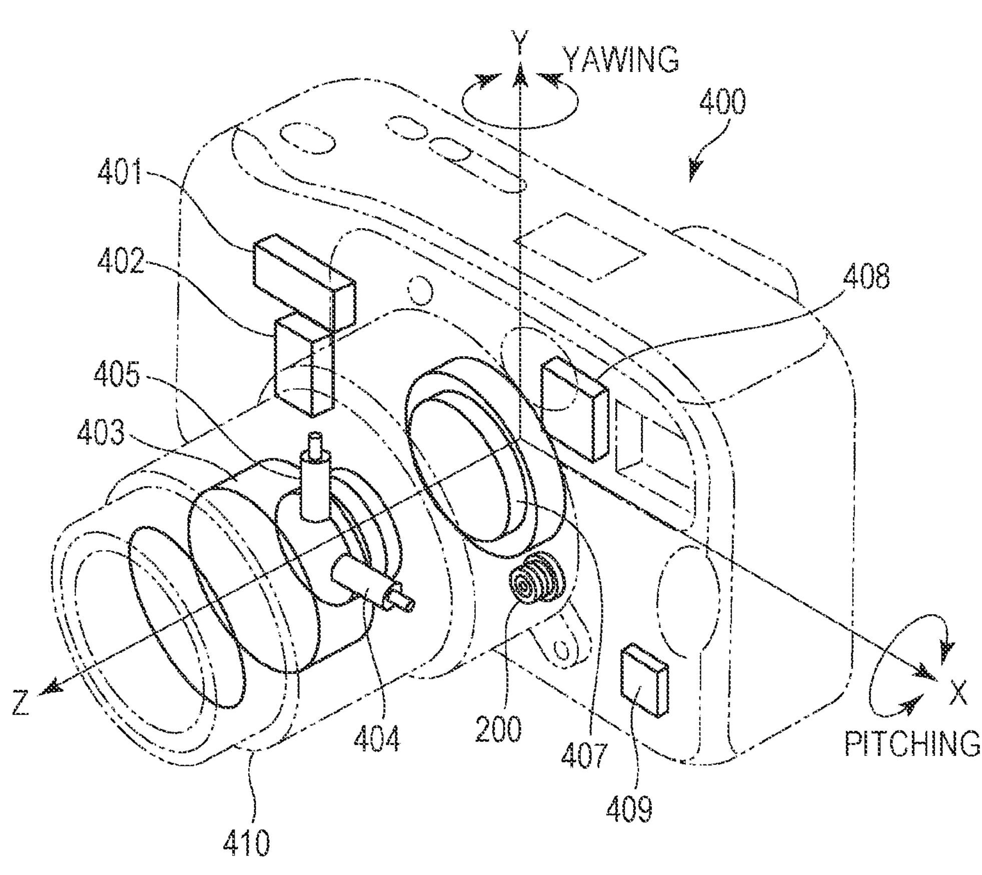
FIG. 10 illustrates a camera device (an imaging device) using a vibration actuator controller of the present disclosure.
Figure 11:
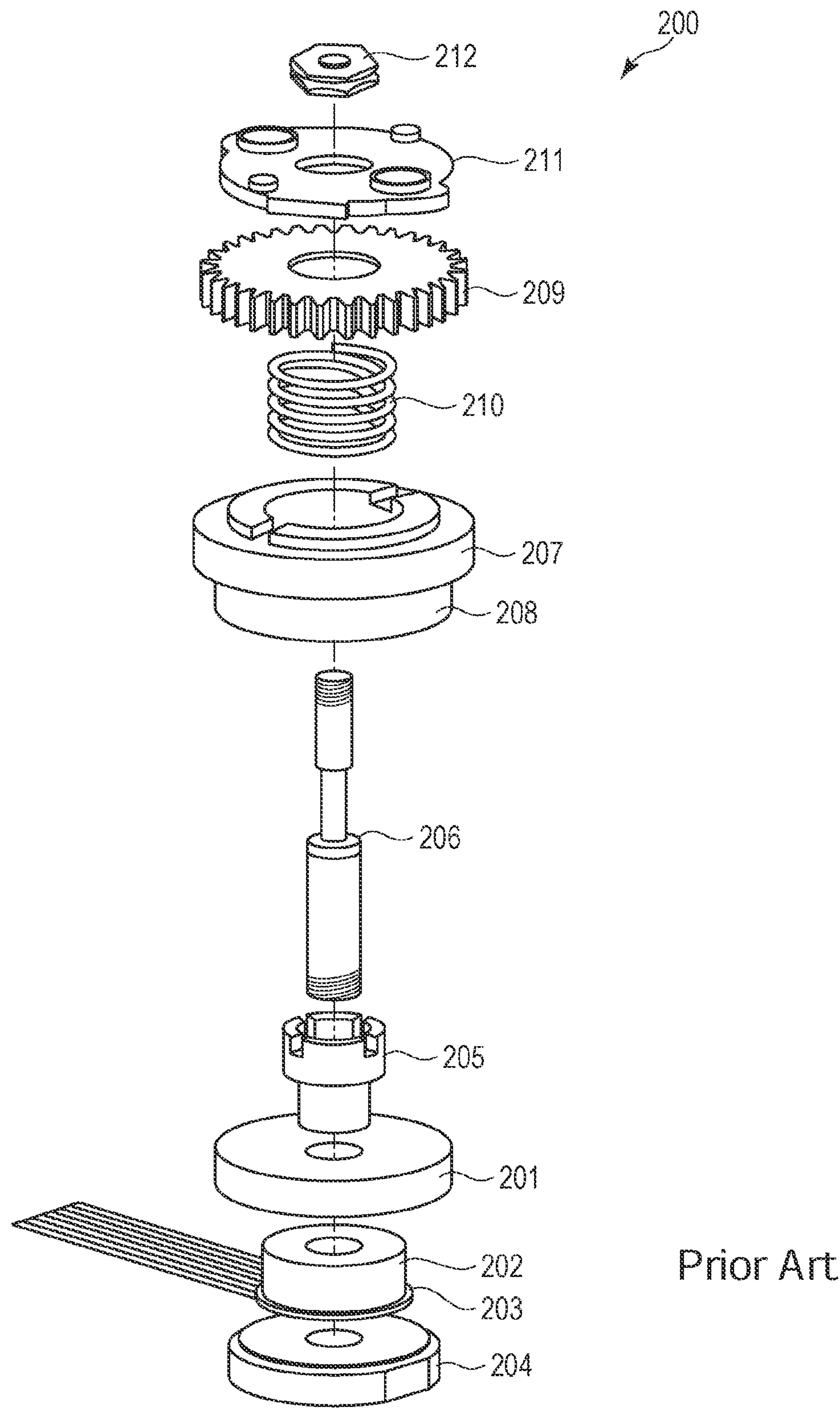
FIG. 11 is an exploded perspective view of a vibration motor as an example of a structure of a vibration actuator.
Figure 12:
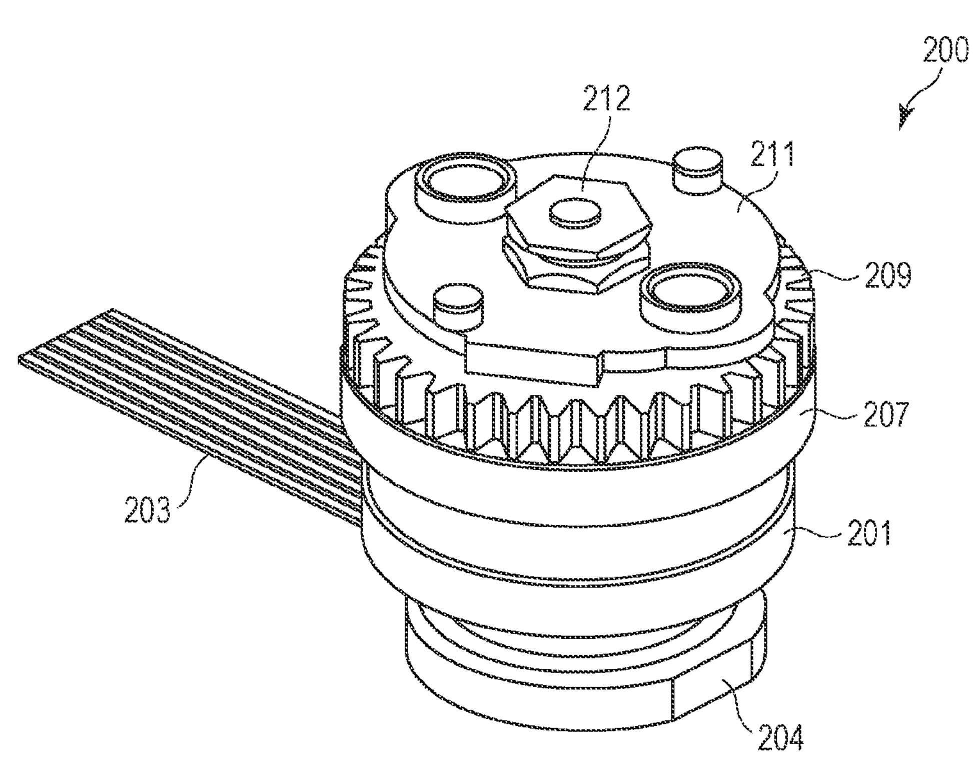
FIG. 12 is a perspective view of a vibration motor as an example of a structure of the vibration actuator after assembly.

The following describes this embodiment (third embodiment) with reference to FIG. 10.

FIG. 10 is a schematic perspective view of a camera device (an imaging device) using the vibration actuator of the present disclosure with some parts illustrated in a transparent manner.

The hardware configuration of the vibration driving device according to this embodiment (third embodiment), as well as the first and second embodiments, is the same as the vibration driving device in FIG. 1A. Thus, corresponding components are assigned the same reference numeral, and descriptions thereof are not repeated.

A lens tube 410 is attached to the front face of a digital camera 400 (imaging device). In the lens tube 410, a plurality of lenses (not illustrated in the drawing) including a focusing lens 407 (a lens group), and a camera shake compensation optical system 403 are arranged. By receiving rotary motion from two coreless motors 404 and 405, the camera shake compensation optical system 403 can vibrate in the top-to-bottom direction (Y direction) and the left-to-right direction (X direction).

An imaging element 408 is disposed in the main body side of the digital camera 400 (imaging device). At the imaging element 408, an optical image is formed based on light passed through the lens tube 410. The imaging element 408 is a photoelectric conversion device such as a complementary metal-oxide semiconductor (CMOS) sensor or charge-coupled device (CCD) sensor. The imaging element 408 converts an optical image into analog electrical signals. The analog electrical signals outputted by the imaging element 408 are converted into digital signals by an A/D converter (not illustrated in the drawing). The digital signals are subsequently subjected to a particular kind of image processing by an image processing circuit (not illustrated in the drawing) and stored as image data (picture data) in a storage medium such as a semiconductor memory (not illustrated in the drawing).

In the main body side of the digital camera 400 (imaging device), a gyro sensor 401 for detecting camera shake (vibration) in the top-to-bottom direction (pitch) and a gyro sensor 402 for detecting camera shake (vibration) in the left-to-right direction are arranged as internal components. The coreless motors 404 and 405 are driven in the direction opposite to vibrations detected by the gyro sensors 401 and 402, so that the optical axis extended in the Z direction of the camera shake compensation optical system 403 is vibrated. As a result, vibration of the optical axis due to camera shake is cancelled out, and thus, a stabilized image is captured in a photograph.

The vibration actuator 200 is driven in the manner of the driving devices described in the first and second embodiments. The vibration actuator 200 moves the focusing lens 407 (lens group) in the optical axis direction (Z direction) disposed at the lens tube 410 by using a gear train not illustrated in the drawing. The present disclosure is not limited to this example. The vibration actuator 200 may be used to move in the optical axis direction any lens group such as a zoom lens (lens group) not illustrated in the drawing. To prevent vibration, the vibration actuator 200 may also be used to perform driving in the direction orthogonal to the optical axis direction of any lens group. To prevent vibration, the vibration actuator 200 may also be used to perform driving in the direction orthogonal to the optical axis direction of the imaging element 408. A drive circuit 409 is incorporated in the main body side of the digital camera 400 (imaging device). The drive circuit 409 serves as a driving device illustrated in FIG. 10, configured to drive the vibration actuator 200 in the manner of the driving devices described in the first and second embodiments.

When the vibration actuator for providing driving controlled in the manner of the present disclosure is installed in a camera device (imaging device), although environmental parameters such as the temperature at which the camera device is used are changed, the vibration actuator can provide driving with stable control characteristics. As a result, photographs and videos can be taken with good image quality.

Vibration actuators are used to move a focusing lens and zoom lens of a device such as a still camera or video camera. Recent still cameras and video cameras have functions of capturing both still and moving images. To capture still images, it is necessary to focus on an object as quickly as possible, and thus, a vibration actuator operates at a high speed. To capture moving images, it is necessary to follow an object, and thus, a vibration actuator needs to operate at a low speed.

As such, vibration actuators need to operate at both high and low speeds, and lenses need to move without variations in speed.

Vibration actuators have a characteristic in which the frequency is shifted due to changes in environmental parameters such as temperature. Thus, by adjusting the characteristic in response to changes in environmental parameters, stable control characteristics can be achieved.

Especially when operation is performed at a low speed, variations in speed produce unnatural moving images.

Thus, by imparting a function of adjusting control characteristics in response to changes in environmental parameters, it is possible to realize a vibration actuator that can provide driving with reduced speed variations. This can improve the quality of moving image when zoom drive is performed, and as a result, the vibration actuator can be used in products for various purposes.

The present disclosure can provide a vibration actuator controller configured to suppress changes in control characteristics due to changes in the frequency characteristic.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-176787 filed Oct. 28, 2021, which is hereby incorporated by reference herein in its entirety.

What is claimed is:

1. A vibration actuator controller configured to control a vibration actuator that includes a vibrating member having an electromechanical energy conversion element and that includes a contact member in contact with the vibrating member, the contact member being configured to move relative to the vibrating member in response to a plurality of pulse signals, the vibration actuator controller comprising:

a processor configured to control a relative movement speed, which is a speed at which the contact member moves relative to the vibrating member, by changing a pulse width of the plurality of pulse signals while maintaining a frequency of the plurality of pulse signals, wherein when the relative movement speed is controlled, the frequency is shifted such that the pulse width and the relative movement speed satisfy a predetermined relationship.

2. The vibration actuator controller according to claim 1, wherein in the predetermined relationship, the pulse width corresponding to the relative movement speed is between a pulse width upper limit value that is set above a predetermined pulse width and a pulse width lower limit value that is set below the predetermined pulse width.

3. The vibration actuator controller according to claim 2, wherein the processor is configured to control when the pulse width corresponding to the relative movement speed is above the pulse width upper limit value, by decreasing the frequency by a preset magnitude of shift, the pulse width corresponding to the relative movement speed to be changed such that the pulse width falls between the pulse width upper limit value and the pulse width lower limit value, and when the pulse width corresponding to the relative movement speed is below the pulse width lower limit value, by increasing the frequency by a preset magnitude of shift, the pulse width corresponding to the relative movement speed to be changed such that the pulse width rises between the pulse width upper limit value and the pulse width lower limit value.

4. The vibration actuator controller according to claim 2, wherein the pulse width upper limit value is obtained by adding a tolerance to the predetermined pulse width, and the pulse width lower limit value is obtained by subtracting the tolerance from the predetermined pulse width.

5. The vibration actuator controller according to claim 1, wherein the predetermined relationship is based on a result obtained by providing driving under a preset condition.

* * * * *